United States Patent
Yin et al.

(10) Patent No.: US 12,071,849 B2
(45) Date of Patent: Aug. 27, 2024

(54) DEVICE AND METHOD FOR SIMULATING GAS INTRUSION AND BULLHEADING IN WELLBORE UNDER DIFFERENT INCLINATIONS

(71) Applicant: CHINA UNIVERSITY OF PETROLEUM (EAST CHINA), Dongying (CN)

(72) Inventors: Bangtang Yin, Dongying (CN); Tianbao Ding, Dongying (CN); Baojiang Sun, Dongying (CN); Zhiyuan Wang, Dongying (CN); Yonghai Gao, Dongying (CN); Hao Li, Dongying (CN); Xiaohui Sun, Dongying (CN); Xuerui Wang, Dongying (CN)

(73) Assignee: CHINA UNIVERSITY OF PETROLEUM (EAST CHINA), Dongying (CN)

( * ) Notice: Subject to any disclaimer, the term of this patent is extended or adjusted under 35 U.S.C. 154(b) by 0 days.

(21) Appl. No.: 18/620,194

(22) Filed: Mar. 28, 2024

(65) Prior Publication Data

US 2024/0240557 A1 Jul. 18, 2024

(30) Foreign Application Priority Data

May 12, 2023 (CN) .......................... 202310535492.3

(51) Int. Cl.
*E21B 49/00* (2006.01)
*E21B 41/00* (2006.01)
*G06F 30/20* (2020.01)

(52) U.S. Cl.
CPC ............ *E21B 49/008* (2013.01); *E21B 41/00* (2013.01); *E21B 2200/20* (2020.05); *G01V 2210/64* (2013.01); *G06F 30/20* (2020.01)

(58) Field of Classification Search
USPC .......................................................... 702/12
See application file for complete search history.

(56) References Cited

U.S. PATENT DOCUMENTS

| | | | | |
|---|---|---|---|---|
| 3,971,926 A | * | 7/1976 | Gau ........................ | G06F 30/20 708/3 |
| 2003/0139916 A1 | * | 7/2003 | Choe ................... | E21B 41/0007 703/10 |

(Continued)

FOREIGN PATENT DOCUMENTS

| | | |
|---|---|---|
| CN | 204113272 U | 1/2015 |
| CN | 206737912 U | 12/2017 |

(Continued)

*Primary Examiner* — Paul D Lee

(57) ABSTRACT

A device for simulating gas intrusion and bullheading in a wellbore under different inclinations is provided, which includes a wellbore outer pipe with an inner pipe and an LED light source therein. An outer wall of the wellbore outer pipe is provided with one or more inlets. A bubble generator is arranged outside a lower plug, and extends through the lower plug via an air inlet needle into the inner cavity of the wellbore outer pipe. An input end of the bubble generator is connected to an air compressor. A lower outlet of the wellbore outer pipe is connected to an inlet of a formation unit through a pipeline and a back pressure valve. A simulating method using such device is also provided.

8 Claims, 2 Drawing Sheets

(56) References Cited

U.S. PATENT DOCUMENTS

| | | | | |
|---|---|---|---|---|
| 2008/0133186 A1* | 6/2008 | Li | ............ | G06F 30/23 |
| | | | | 703/2 |
| 2020/0141208 A1* | 5/2020 | Agrawal | ........ | E21B 41/00 |
| 2023/0335015 A1* | 10/2023 | Deng | ........ | G09B 25/02 |

FOREIGN PATENT DOCUMENTS

| | | | |
|---|---|---|---|
| CN | 107542443 | A | 1/2018 |
| CN | 108222926 | A | 6/2018 |
| CN | 209354122 | U | 9/2019 |
| CN | 111042809 | A | 4/2020 |
| CN | 111075390 | A | 4/2020 |
| CN | 111502631 | A | 8/2020 |
| CN | 111878058 | A | 11/2020 |
| CN | 112083507 | A | 12/2020 |
| CN | 112943233 | A | 6/2021 |
| CN | 114737962 | A | 7/2022 |
| CN | 115059454 | A | 9/2022 |

* cited by examiner

DEVICE AND METHOD FOR SIMULATING GAS INTRUSION AND BULLHEADING IN WELLBORE UNDER DIFFERENT INCLINATIONS

CROSS-REFERENCE TO RELATED APPLICATIONS

This application claims the benefit of priority from Chinese Patent Application No. 202310535492.3, filed on May 12, 2023. The content of the aforementioned application, including any intervening amendments made thereto, is incorporated herein by reference in its entirety.

TECHNICAL FIELD

This application relates to offshore drilling, and more particularly to a device and method for simulating gas intrusion and bullheading in a wellbore under different inclinations.

BACKGROUND

As the focus of oil and gas production gradually shifts to deep formations and deep water, horizontal wells have become an important development well type. Deep gas reservoirs are generally characterized by large well depth, high temperature and pressure, multi-fracture development and multiple sections with a narrow safety density window, and thus it is highly probable to encounter formations with abnormal pressure during drilling, resulting in high occurrence rate of overflow. The conventional forward/reverse circulation killing method often leads to more serious leakage, alternating overflow and leakage, or even out-of-control blowout and well abandonment. In addition, when encountering a deep hydrogen sulfide ($H_2S$)-bearing formation during the drilling, the conventional circulating well-killing method is even less applicable, and by comparison, the bullheading well-killing method can directly press the overflow gas containing $H_2S$ back into the formation, which is a commonly-used well killing method for overflow in deep gas reservoir drilling.

During the well killing process of the bullheading method, the killing fluid is pumped from the wellhead annulus toward the well bottom, which is exactly opposite to the upward movement of the intrusion gas from the well bottom, forming a multi-phase counter-current gas-liquid flow in the vertical-inclined-horizontal annulus of the wellbore. If the upwardly-migrating intrusion gas is continuously reversed under the action of the killing fluid to migrate to the well bottom with the killing fluid, and is finally completely pressed back into the formation, the well is successfully killed. The flow pattern changes in the order of an annular flow, a slug flow and a bubble flow, which is completely different from the conventional gas-liquid co-current two-phase flow.

At present, the design of well killing parameters, such as killing flow rate and well killing timing, often relies on experience instead of scientific basis during the bullheading process, and thus multiple well killing operations are often performed blindly. The key issue is that the dynamic characteristics of bubbles with different sizes, such as small bubbles, Taylor bubbles and liquid membrane-containing gas cores, during the period of upward migration in the killing fluid—turning under the action of the killing fluid—being pressed back by the killing fluid are extremely complex. The existing bubble rising velocity models cannot accurately describe such process.

SUMMARY

An object of the disclosure is to provide a device and method for simulating gas intrusion and bullheading in a wellbore under different inclinations to overcome the above deficiencies in the prior art. This application enables the visualization of bubbles with different sizes during the entire process of migration, turning, descending and entering the formation under the action of a killing fluid, so as to facilitate investigating the deformation and migration mechanism of the bubbles under the action of the killing fluid, thereby providing a certain theoretical support for the design of well killing parameters involved in a bullheading method.

Technical solutions of the present disclosure are described as follows.

In a first aspect, this application provides a device for simulating gas intrusion and bullheading in a wellbore under different inclinations, comprising a formation unit, an air compressor, a bubble generator, an air inlet needle, a lower plug, a back pressure valve, a liquid storage tank, a screw pump, a three-way valve, an upper plug, one or more inlets, a light-emitting diode (LED) light source, a flange, an inner pipe, a wellbore outer pipe, a metal bracket and a first angle adjusting mechanism; wherein the inner pipe and the LED light source are provided in an inner cavity of the wellbore outer pipe; the upper plug is provided at an upper end of the wellbore outer pipe; the lower plug is provided at a lower end of the wellbore outer pipe; the flange is provided at a middle of the wellbore outer pipe, and is connected to the metal bracket through the first angle adjusting mechanism; an outer wall of the wellbore outer pipe is provided with the one or more inlets; the bubble generator is arranged outside the lower plug; an output end of the bubble generator passes through the lower plug via the air inlet needle to extend into the inner cavity of the wellbore outer pipe; an input end of the bubble generator is connected to the air compressor; a lower outlet of the wellbore outer pipe is connected to an inlet of the formation unit through a first pipeline and the back pressure valve; an outlet of the formation unit is connected to the liquid storage tank through a second pipeline; a lower end of the liquid storage tank is connected to the upper end of the wellbore outer pipe through a third pipeline, the screw pump and the three-way valve; and a camera is arranged at an outer side of the wellbore outer pipe, and is connected to a computer through a wire.

In some embodiments, an outside of each of the one or more inlets is connected to a simulated relief well; the simulated relief well comprises a second angle adjusting mechanism, a vertical section, a first connector and a build-up section; the vertical section is connected to a first end of the build-up section through the first connector; a second end of the build-up section is connected to a corresponding one of the one or more inlets; and an outer wall of the vertical section is connected to the second angle adjusting mechanism.

In some embodiments, the formation unit comprises a plurality of simulated formation fractures and two simulation sleeves; the plurality of simulated formation fractures are provided between the two simulation sleeves; an adjusting rod is provided in each of the two simulation sleeves; a lower end of the adjusting rod is provided with a piston; an upper end of the adjusting rod is provided with a knob; and the piston is configured to be moved up and down to control the number of connected simulated formation fractures among the plurality of simulated formation fractures.

In some embodiments, each of the plurality of simulated formation fractures is a gap formed by two acrylic sheets; a sealing plate is provided around each of the two acrylic sheets; both ends of each of the two acrylic sheets are each provided with a second connector; the gap formed by the two acrylic sheets is connected to a liquid outlet of each of the two simulation sleeves through the second connector; and an adjusting bolt is provided around each of the two acrylic sheets, and is configured to adjust a width of the gap.

In some embodiments, the first angle adjusting mechanism comprises a fixing plate, one or more fixing bolts, a connecting hole, a semicircular connecting plate and a connecting bolt; the fixing plate is connected to the metal bracket through the one or more fixing bolts and the connecting hole; the semicircular connecting plate is provided at an outer side of the fixing plate; a semicircular annular adjusting groove is provided in the semicircular connecting plate; and the connecting bolt passes through the semicircular annular adjusting groove to be connected to the flange to facilitate adjustment of an inclination of the wellbore outer pipe.

In some embodiments, an output end of the air compressor is connected to the input end of the bubble generator through a fourth pipeline, a pressure relief valve, a pressure stabilizing valve, a gas flow regulator and a one-way valve.

In some embodiments, an output end of the screw pump is connected to the upper end of the wellbore outer pipe through the third pipeline, a first ball valve, the three-way valve and a first liquid flow meter.

In some embodiments, an upper outlet of the three-way valve is connected to an upper end of the vertical section through a fifth pipeline and a second liquid flow meter.

In some embodiments, the lower outlet of the wellbore outer pipe is connected to a lower end of one of the two simulation sleeves through the first pipeline, a second ball valve and the back pressure valve.

In a second aspect, this application provides a method for gas intrusion and bullheading in a wellbore under different inclinations using the above device, comprising:

step (1) testing an air tightness of the device through steps of:
- under control of the computer, adjusting the first angle adjusting mechanism such that an angle between the wellbore outer pipe and ground is 90°, opening the first ball valve and adjusting the three-way valve such that the third pipeline connected to the upper end of the wellbore outer pipe is opened, and the fifth pipeline connected to the simulated relief well is closed; closing the second ball valve and starting the screw pump to fill the wellbore outer pipe with a liquid phase with a certain density and viscosity; and stopping the screw pump after the wellbore outer pipe is filled;

step (2) starting the air compressor, and adjusting the pressure relief valve and the pressure stabilizing valve to enable continuous and stable gas output; adjusting the gas flow regulator and the bubble generator to allow bubbles to be stably generated from the air inlet needle through the one-way valve, and recording a gas phase displacement at this moment; after the bubbles rise for a period of time, turning on the LED light source, adjusting a position and a focal length of the camera to make a lens of the camera parallel to the wellbore outer pipe, so as to achieve visualization of morphological changes of the bubbles during migration; and photographing a migration process of the bubbles in a static liquid phase at this moment;

step (3) controlling the gas phase displacement, opening the second ball valve, and adjusting a back pressure of the back pressure valve to simulate a formation pressure; adjusting a position of the piston through the knob, such that one or more of the plurality of simulated formation fractures are opened; rotating the adjusting bolt to form different fracture apertures between the two acrylic sheets; adjusting a liquid phase displacement and recording processes of upward migration-turning downward-bullheading of the bubbles under different liquid phase displacements, wherein when a large number of bubbles are present in the wellbore outer pipe, the liquid phase displacement is adjusted to press all of the bubbles back ahead of an experiment to eliminate an influence of bubbles carried by the liquid phase on a migration process of newly-generated bubbles;

step (4) after experiments under all liquid phase displacements are completed, adjusting the formation pressure, fracture aperture and the number of opened simulated formation fractures, and performing experiments on bubble migration and bullheading under different formation conditions; and after the experiments under all of the formation conditions are completed, adjusting an inclination of the wellbore outer pipe, and photographing migration processes of the bubbles under different inclinations, different liquid phase displacements and different formation conditions;

step (5) after all experiments under different inclinations, different liquid phase displacements and different formation conditions are completed, restoring the inclination of the wellbore outer pipe to 90°, adjusting the gas phase displacement, and repeating steps (2)-(5), so as to complete experiments under different gas phase displacements;

step (6) adjusting a position of the gas intrusion, connecting a gas inlet pipeline to another one of the one or more inlets at the outer wall of the wellbore outer pipe to simulate the gas intrusion and bullheading at different positions, and repeating steps (2)-(6);

step (7) adjusting the upper outlet of the three-way valve, such that the fifth pipeline connected to the simulated relief well is opened and the upper end of the wellbore outer pipe is closed; adjusting a connecting position between the build-up section and the wellbore outer pipe, adjusting an angle of the vertical section, and repeating the steps (2)-(5) to simulate well killing of the simulated relief well under different positions and different angles;

step (8) restoring the device, cleaning the inner cavity of the wellbore outer pipe and an inner cavity of the liquid storage tank, and replacing the liquid phase; and repeating steps (1)-(8) to complete experiments of the gas intrusion and bullheading under different liquid phase densities and viscosities; and step (9) taking the inner pipe out from the inner cavity of the wellbore outer pipe, repeating steps (1)-(8) to perform experiments of gas intrusion and bullheading in the wellbore outer pipe under different inclinations of the wellbore outer pipe, different gas phase displacements, different liquid phase displacements, different formation conditions, different gas intrusion positions, different bullheading positions, different angles of the simulated relief well, and different liquid phase densities and viscosities, thereby providing theoretical support for a design of well killing parameters in an actual bullheading operation.

Compared with the prior art, this application has the following beneficial effects.

1. This application can simulate the intrusion and bullheading processes of bubbles with different sizes under different formation parameters (e.g., formation pressure, width of simulated formation fracture, and the number of simulated formation fractures), different inclinations, different killing positions and different liquid phase displacements, which can be performed in a separate wellbore outer pipe or a wellbore outer pipe equipped with an inner pipe. This application uses the camera to capture an entire process of upward migration, turning downward and bullheading of the bubbles, thereby extracting a series of parameters of the bubbles during the generation and movement processes, such as volume, generation time, detachment frequency, speed, aspect ratio, etc., so as to investigate the deformation and migration mechanism of the bubbles in a countercurrent, and provide certain theoretical support for the design of well killing parameters in the bullheading operation.

2. The device provided herein has simple structure, easy assembly and diversified functions. The wellbore outer pipe, the inner pipe and the formation unit are made of transparent acrylic sheets, which can simulate the gas intrusion and well killing experiments at different positions. In addition, the entire process of gas intrusion and bullheading can be clearly visualized.

Figure 1:
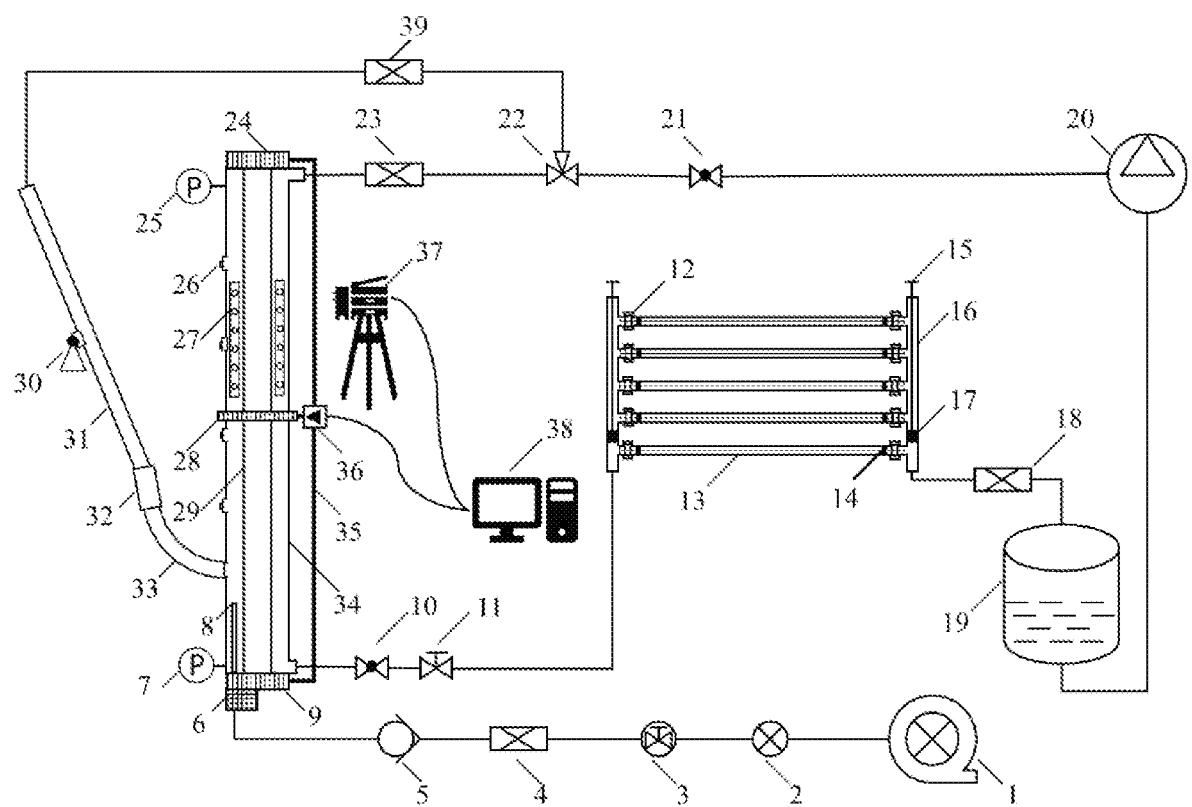
FIG. 1 is a structural diagram of a device for simulating gas intrusion and bullheading in a wellbore under different inclinations in accordance with an embodiment of the present disclosure.

In the drawings: 1, air compressor; 2, pressure relief valve; 3, pressure stabilizing valve; 4, gas flow regulator; 5, one-way valve; 6, bubble generator; 7, first pressure sensor; 8, air inlet needle; 9, lower plug; 10, second ball valve; 11, back pressure valve; 12, adjusting bolt; 13, simulated formation fracture; 14, sealing plate; 15, knob; 16, simulation sleeve; 17, piston; 18, liquid flow meter; 19, liquid storage tank; 20, screw pump; 21, first ball valve; 22, three-way valve; 23, first liquid flow meter; 24, upper plug; 25, second pressure sensor; 26, inlet; 27, light-emitting diode (LED) light source; 28, flange; 29, inner pipe; 30, second angle adjusting mechanism; 31, vertical section; 32, first connector; 33, build-up section; 34, wellbore outer pipe; 35, metal bracket; 36, first angle adjusting mechanism; 37, camera; 38, computer; 39, second liquid flow meter; 36.1, fixing plate; 36.2, fixing bolt; 36.3, connecting hole; 36.4, semicircular connecting plate; 36.5, connecting bolt; and 36.6, semicircular annular adjusting groove.

DETAILED DESCRIPTION OF EMBODIMENTS

The embodiments of the present disclosure will be described below with reference to the accompanying drawings. It should be understood that the embodiments described herein are merely intended to illustrate and explain the present disclosure, and are not intended to limit the scope of the present disclosure.

Figure 2:
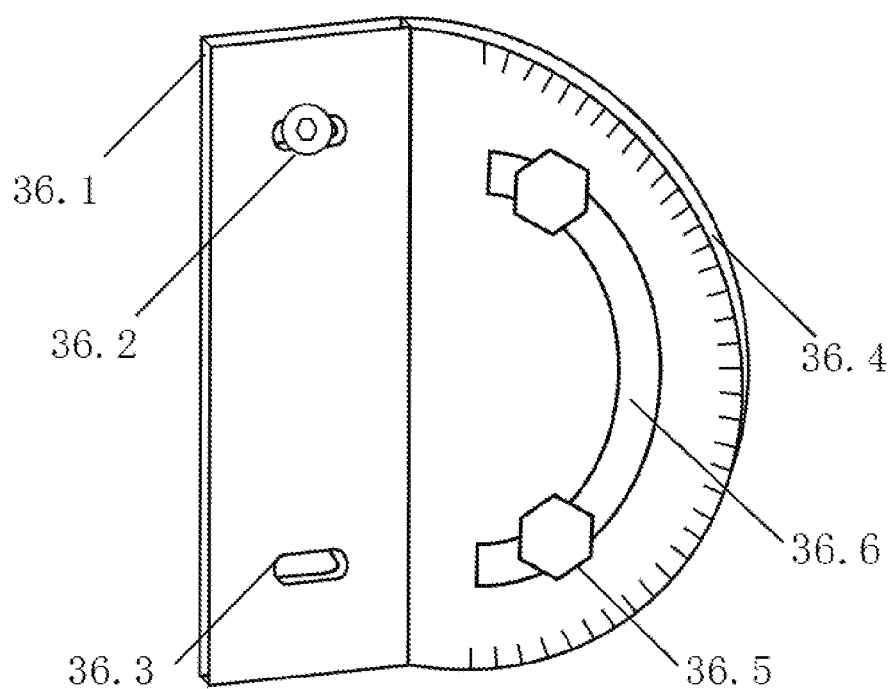
FIG. 2 is a structural diagram of a first angle adjusting mechanism of the device in accordance with an embodiment of the present disclosure.

Referring to FIGS. 1-2, this application provides for simulating gas intrusion and bullheading in a wellbore under different inclinations, which includes a formation unit, an air compressor 1, a bubble generator 6, an air inlet needle 8, a lower plug 9, a back pressure valve 11, a liquid storage tank 19, a screw pump 20, a three-way valve 22, an upper plug 24, one or more inlets 26, a light-emitting diode (LED) light source 27, a flange 28, an inner pipe 29, a wellbore outer pipe 34, a metal bracket 35 and a first angle adjusting mechanism 36. The inner pipe 29 and the LED light source 27 are provided in an inner cavity of the wellbore outer pipe 34. The upper plug 24 is provided at an upper end of the wellbore outer pipe 34. The lower plug 9 is provided at a lower end of the wellbore outer pipe 34. The flange 28 is provided at a middle of the wellbore outer pipe 34, and is connected to the metal bracket 35 through the first angle adjusting mechanism 36. An outer wall of the wellbore outer pipe 34 is provided with the one or more inlets 26. The bubble generator 6 is arranged outside the lower plug 9. An output end of the bubble generator 6 passes through the lower plug 9 via the air inlet needle 8 to extend into the inner cavity of the wellbore outer pipe 34. An input end of the bubble generator 6 is connected to the air compressor 1. A lower outlet of the wellbore outer pipe 34 is connected to an inlet of the formation unit through a first pipeline and the back pressure valve 11. An outlet of the formation unit is connected to the liquid storage tank 19 through a second pipeline and a liquid flow meter 18. A lower end of the liquid storage tank 19 is connected to the upper end of the wellbore outer pipe 34 through a third pipeline, the screw pump 20 and the three-way valve 22. A camera 37 is arranged at an outer side of the wellbore outer pipe 34, and is connected to a computer 38 through a wire. A second pressure sensor 25 is provided on an upper side of the wellbore outer pipe 34. A first pressure sensor 7 is provided on a lower side of the wellbore outer pipe 34.

An outside of each of the one or more inlets 26 is connected to a simulated relief well. The simulated relief well includes a second angle adjusting mechanism 30, a vertical section 31, a first connector 32 and a build-up section 33. The vertical section 31 is connected to a first end of the build-up section through the first connector 32. A second end of the build-up section 33 is connected to a corresponding inlet 26. An outer wall of the vertical section 31 is connected to the second angle adjusting mechanism 30.

The formation unit includes a plurality of simulated formation fractures 13, a knob 15, two simulation sleeves 16 and a piston 17. The plurality of simulated formation fractures 13 are provided between the two simulation sleeves 16. An adjusting rod is provided in each of the two simulation sleeves 16. A lower end of the adjusting rod is provided with the piston 17. An upper end of the adjusting rod is provided with the knob 15. The piston 17 is configured to be moved up and down to control the number of connected simulated formation fractures among the plurality of simulated formation fractures 13.

Each of the plurality of simulated formation fractures 13 is a gap formed by two acrylic sheets. A sealing plate 14 is provided around each of the two acrylic sheets. Both ends of each of the two acrylic sheets are each provided with a second connector. The gap formed by the two acrylic sheets is connected to a liquid outlet of each of the two simulation sleeves 16 through the second connector. An adjusting bolt 12 is provided around each of the two acrylic sheets, and is configured to adjust a width of the gap.

The first angle adjusting mechanism 36 includes a fixing plate 36.1, one or more fixing bolts 36.2, a connecting hole 36.3, a semicircular connecting plate 36.4 and a connecting bolt 36.5. The fixing plate 36.1 is connected to the metal bracket 35 through the one or more fixing bolts 36.2 and the connecting hole 36.3. The semicircular connecting plate 36.4 is provided at an outer side of the fixing plate 36.1. A semicircular annular adjusting groove 36.6 is provided in the semicircular connecting plate 36.4. The connecting bolt 36.5 passes through the semicircular annular adjusting groove 36.6 to be connected to the flange 28 to facilitate adjustment of an inclination of the wellbore outer pipe 34. In addition, a structure of the second angle adjusting mechanism 30 can be referred to the first angle adjusting mechanism 36.

An output end of the air compressor 1 is connected to the input end of the bubble generator 6 through a fourth pipeline, a pressure relief valve 2, a pressure stabilizing valve 3, a gas flow regulator 4 and a one-way valve 5.

An output end of the screw pump 20 is connected to the upper end of the wellbore outer pipe 34 through the third pipeline, a first ball valve 21, the three-way valve 22 and a first liquid flow meter 23.

An upper outlet of the three-way valve 22 is connected to an upper end of the vertical section 31 through a fifth pipeline and a second liquid flow meter 39.

The lower outlet of the wellbore outer pipe 34 is connected to a lower end of one of the two simulation sleeves 16 through the first pipeline, a second ball valve 10 and the back pressure valve 11.

This application provides a method for gas intrusion and bullheading in a wellbore under different inclinations using the above device, which includes the following steps.

Step (1) An air tightness of the device is tested through the following steps. Under control of the computer 38, the first angle adjusting mechanism is adjusted such that an angle between the wellbore outer pipe 34 and ground is 90°. The first ball valve 21 is opened, and the three-way valve 22 is adjusted such that the third pipeline connected to the upper end of the wellbore outer pipe 34 is opened, and the fifth pipeline connected to the simulated relief well is closed. The second ball valve is closed. The screw pump is started to fill the wellbore outer pipe 34 with a liquid phase with a certain density and viscosity. After the wellbore outer pipe 34 is filled, the screw pump 20 is stopped.

Step (2) The air compressor is started. The pressure relief valve 2 and the pressure stabilizing valve 3 are adjusted to enable continuous and stable gas output. The gas flow regulator 4 and the bubble generator 6 are adjusted to allow bubbles to be stably generated from the air inlet needle 8 through the one-way valve 5. A gas phase displacement is recorded at this moment. After the bubbles rise for a period of time, the LED light source is turned on. A position and a focal length of the camera 37 are adjusted to make a lens of the camera 37 parallel to the wellbore outer pipe 34, so as to achieve visualization of morphological changes of the bubbles during migration. A migration process of the bubbles in a static liquid phase is photographed at this moment.

Step (3) The gas phase displacement is controlled. The second ball valve 10 is opened. A back pressure of the back pressure valve 11 is adjusted to simulate a formation pressure. A position of the piston 17 is adjusted through the knob 15 such that one or more of the plurality of simulated formation fractures are opened. The adjusting bolt 12 is rotated to form different fracture apertures between the two acrylic sheets. A liquid phase displacement is adjusted. Processes of upward migration-turning downward-bullheading of the bubbles under different liquid phase displacements are recorded. When a large number of bubbles are present in the wellbore outer pipe 34, the liquid phase displacement is adjusted to press all of the bubbles back ahead of an experiment to eliminate an influence of bubbles carried by the liquid phase on a migration process of newly-generated bubbles.

Step (4) After experiments under all liquid phase displacements are completed, the formation pressure, fracture aperture and the number of opened simulated formation fractures 13 are adjusted. Experiments on bubble migration and bullheading under different formation conditions are performed. After the experiments under all of the formation conditions are completed, an inclination of the wellbore outer pipe 34 is adjusted. Migration processes of the bubbles under different inclinations, different liquid phase displacements and different formation conditions are photographed.

Step (5) After all experiments under the different inclinations, different liquid phase displacements and different formation conditions are completed, the inclination of the wellbore outer pipe 34 is restored to 90°. The gas phase displacement is adjusted. Steps (2)-(5) are repeated, so as to complete experiments under different gas phase displacements.

Step (6) A position of the gas intrusion is adjusted. A gas inlet pipeline is connected to another one of the one or more inlets 26 at the outer wall of the wellbore outer pipe 34 to simulate the gas intrusion and bullheading at different positions. Steps (2)-(6) are repeated.

Step (7) The upper outlet of the three-way valve 22 is adjusted such that the fifth pipeline connected to the simulated relief well is opened and the upper end of the wellbore outer pipe 34 is closed. A connecting position between the build-up section 33 and the wellbore outer pipe 34 is adjusted. An angle of the vertical section 31 is adjusted. Steps (2)-(5) are repeated to simulate well killing of the simulated relief well under different positions and different angles.

Step (8) The device is restored. The inner cavity of the wellbore outer pipe 34 and an inner cavity of the liquid storage tank 19 are cleaned. The liquid phase is replaced. Steps (1)-(8) are repeated to complete experiments of the gas intrusion and bullheading under different liquid phase densities and viscosities.

Step (9) The inner pipe 29 is taken from the inner cavity of the wellbore outer pipe 34. Steps (1)-(8) are repeated to perform experiments of gas intrusion and bullheading in the wellbore outer pipe 34 under different inclinations of the wellbore outer pipe 34, different gas phase displacements, different liquid phase displacements, different formation conditions, different gas intrusion positions, different bullheading positions, different angles of the simulated relief well, and different liquid phase densities and viscosities, thereby providing theoretical support for a design of well killing parameters in an actual bullheading operation.

The embodiments described above are merely illustrative of the present application, and are not intended to limit the disclosure. Various modifications, changes and replacements made by those skilled in the art without departing from the spirit of the disclosure shall fall within the scope of the disclosure defined by the appended claims.

What is claimed is:

1. A device for simulating gas intrusion and bullheading in a wellbore under different inclinations, comprising:
   a formation unit;
   an air compressor;
   a bubble generator;
   an air inlet needle;
   a lower plug;

a back pressure valve;
a liquid storage tank;
a screw pump;
a three-way valve;
an upper plug;
one or more inlets;
a light-emitting diode (LED) light source;
a flange;
an inner pipe;
a wellbore outer pipe;
a metal bracket; and
a first angle adjusting mechanism;
wherein the inner pipe and the LED light source are provided in an inner cavity of the wellbore outer pipe; the upper plug is provided at an upper end of the wellbore outer pipe; the lower plug is provided at a lower end of the wellbore outer pipe; the flange is provided at a middle of the wellbore outer pipe, and is connected to the metal bracket through the first angle adjusting mechanism; an outer wall of the wellbore outer pipe is provided with the one or more inlets; the bubble generator is arranged outside the lower plug; an output end of the bubble generator passes through the lower plug via the air inlet needle to extend into the inner cavity of the wellbore outer pipe; an input end of the bubble generator is connected to the air compressor; a lower outlet of the wellbore outer pipe is connected to an inlet of the formation unit through a first pipeline and the back pressure valve; an outlet of the formation unit is connected to the liquid storage tank through a second pipeline; a lower end of the liquid storage tank is connected to the upper end of the wellbore outer pipe through a third pipeline, the screw pump and the three-way valve; and a camera is arranged at an outer side of the wellbore outer pipe, and is connected to a computer through a wire;
an outside of each of the one or more inlets is connected to a simulated relief well; the simulated relief well comprises a second angle adjusting mechanism, a vertical section, a first connector and a build-up section; the vertical section is connected to a first end of the build-up section through the first connector; a second end of the build-up section is connected to a corresponding one of the one or more inlets; and an outer wall of the vertical section is connected to the second angle adjusting mechanism; and
the formation unit comprises a plurality of simulated formation fractures and two simulation sleeves; the plurality of simulated formation fractures are provided between the two simulation sleeves; an adjusting rod is provided in each of the two simulation sleeves; a lower end of the adjusting rod is provided with a piston; an upper end of the adjusting rod is provided with a knob; and the piston is configured to be moved up and down to control the number of connected simulated formation fractures among the plurality of simulated formation fractures.

2. The device of claim 1, wherein each of the plurality of simulated formation fractures is a gap formed by two acrylic sheets; a sealing plate is provided around each of the two acrylic sheets; both ends of each of the two acrylic sheets are each provided with a second connector; the gap formed by the two acrylic sheets is connected to a liquid outlet of each of the two simulation sleeves through the second connector; and an adjusting bolt is provided around each of the two acrylic sheets, and is configured to adjust a width of the gap.

3. The device of claim 2, wherein the first angle adjusting mechanism comprises a fixing plate, one or more fixing bolts, a connecting hole, a semicircular connecting plate and a connecting bolt; the fixing plate is connected to the metal bracket through the one or more fixing bolts and the connecting hole; the semicircular connecting plate is provided at an outer side of the fixing plate; a semicircular annular adjusting groove is provided in the semicircular connecting plate; and the connecting bolt passes through the semicircular annular adjusting groove to be connected to the flange to facilitate adjustment of an inclination of the wellbore outer pipe.

4. The device of claim 3, wherein an output end of the air compressor is connected to the input end of the bubble generator through a fourth pipeline, a pressure relief valve, a pressure stabilizing valve, a gas flow regulator and a one-way valve.

5. The device of claim 4, wherein an output end of the screw pump is connected to the upper end of the wellbore outer pipe through the third pipeline, a first ball valve, the three-way valve and a first liquid flow meter.

6. The device of claim 5, wherein an upper outlet of the three-way valve is connected to an upper end of the vertical section through a fifth pipeline and a second liquid flow meter.

7. The device of claim 6, wherein the lower outlet of the wellbore outer pipe is connected to a lower end of one of the two simulation sleeves through the first pipeline, a second ball valve and the back pressure valve.

8. A method for gas intrusion and bullheading in a wellbore under different inclinations using the device of claim 7, comprising:
step (1) testing an air tightness of the device through steps of:
under control of the computer, adjusting the first angle adjusting mechanism such that an angle between the wellbore outer pipe and ground is 90°, opening the first ball valve and adjusting the three-way valve such that the third pipeline connected to the upper end of the wellbore outer pipe is opened, and the fifth pipeline connected to the simulated relief well is closed; closing the second ball valve and starting the screw pump to fill the wellbore outer pipe with a liquid phase with a certain density and viscosity; and stopping the screw pump after the wellbore outer pipe is filled;
step (2) starting the air compressor, and adjusting the pressure relief valve and the pressure stabilizing valve to enable continuous and stable gas output; adjusting the gas flow regulator and the bubble generator to allow bubbles to be stably generated from the air inlet needle through the one-way valve, and recording a gas phase displacement at this moment; after the bubbles rise for a period of time, turning on the LED light source, adjusting a position and a focal length of the camera to make a lens of the camera parallel to the wellbore outer pipe, so as to achieve visualization of morphological changes of the bubbles during migration; and photographing a migration process of the bubbles in a static liquid phase at this moment;
step (3) controlling the gas phase displacement, opening the second ball valve, and adjusting a back pressure of the back pressure valve to simulate a formation pressure; adjusting a position of the piston through the knob, such that one or more of the plurality of simulated formation fractures are opened; rotating the adjusting bolt to form different fracture apertures between the two acrylic sheets; adjusting a liquid phase displacement and recording processes of upward migration-turning downward-bullheading of the bubbles under different liquid phase displacements, wherein when a large number of bubbles are present in the wellbore outer pipe, the liquid phase displacement is adjusted to press all of the bubbles back ahead of an experiment to eliminate an influence of bubbles carried by the liquid phase on a migration process of newly-generated bubbles;

step (4) after experiments under all liquid phase displacements are completed, adjusting the formation pressure, fracture aperture and the number of opened simulated formation fractures, and performing experiments on bubble migration and bullheading under different formation conditions; and after the experiments under all of the formation conditions are completed, adjusting an inclination of the wellbore outer pipe, and photographing migration processes of the bubbles under different inclinations, different liquid phase displacements and different formation conditions;

step (5) after all experiments under different inclinations, different liquid phase displacements and different formation conditions are completed, restoring the inclination of the wellbore outer pipe to 90°, adjusting the gas phase displacement, and repeating steps (2)-(5), so as to complete experiments under different gas phase displacements;

step (6) adjusting a position of the gas intrusion, connecting a gas inlet pipeline to another one of the one or more inlets at the outer wall of the wellbore outer pipe to simulate the gas intrusion and bullheading at different positions, and repeating steps (2)-(6);

step (7) adjusting the upper outlet of the three-way valve, such that the fifth pipeline connected to the simulated relief well is opened and the upper end of the wellbore outer pipe is closed; adjusting a connecting position between the build-up section and the wellbore outer pipe, adjusting an angle of the vertical section, and repeating the steps (2)-(5) to simulate well killing of the simulated relief well under different positions and different angles;

step (8) restoring the device, cleaning the inner cavity of the wellbore outer pipe and an inner cavity of the liquid storage tank, and replacing the liquid phase; and repeating steps (1)-(8) to complete experiments of the gas intrusion and bullheading under different liquid phase densities and viscosities; and step (9) taking the inner pipe out from the inner cavity of the wellbore outer pipe, repeating steps (1)-(8) to perform experiments of gas intrusion and bullheading in the wellbore outer pipe under different inclinations of the wellbore outer pipe, different gas phase displacements, different liquid phase displacements, different formation conditions, different gas intrusion positions, different bullheading positions, different angles of the simulated relief well, and different liquid phase densities and viscosities, thereby providing theoretical support for a design of well killing parameters in an actual bullheading operation.

* * * * *